United States Patent
Huang

(10) Patent No.: US 9,705,668 B2
(45) Date of Patent: *Jul. 11, 2017

(54) DUAL PATH TIMING JITTER REMOVAL

(71) Applicant: Silicon Laboratories Inc., Austin, TX (US)

(72) Inventor: Yunteng Huang, Palo Alto, CA (US)

(73) Assignee: Silicon Laboratories Inc., Austin, TX (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/725,053

(22) Filed: May 29, 2015

(65) Prior Publication Data

US 2016/0352505 A1 Dec. 1, 2016

(51) Int. Cl.
*H03D 3/24* (2006.01)
*H04L 7/033* (2006.01)
*H04L 27/227* (2006.01)

(52) U.S. Cl.
CPC ........ *H04L 7/0332* (2013.01); *H04L 27/2272* (2013.01)

(58) Field of Classification Search
CPC .............. G01R 31/31709; H04L 1/004; H04L 2027/0067; H04L 2027/0069; H04L 27/066; H04L 27/22; H04L 27/2272; H04L 7/0331; H04L 7/0332; H04L 7/0334; H04L 7/0338; H04L 7/0025; H03L 7/091

See application file for complete search history.

(56) References Cited

U.S. PATENT DOCUMENTS

| | | | | |
|---|---|---|---|---|
| 4,151,485 A | * | 4/1979 | LaFratta | H03L 7/089 331/1 A |
| 5,563,891 A | * | 10/1996 | Wang | H04J 3/073 370/505 |
| 5,986,485 A | * | 11/1999 | O'Sullivan | H03L 7/095 327/156 |
| 7,417,510 B2 | | 8/2008 | Huang | |
| 9,344,271 B1 | * | 5/2016 | Dusatko | H04L 7/0331 |
| 2005/0185747 A1 | * | 8/2005 | White | H03D 13/004 375/375 |

(Continued)

OTHER PUBLICATIONS

J. G. Maneatis, "Low-jitter process-independent DLL and PLL based on self-biased techniques," in IEEE Journal of Solid-State Circuits, vol. 31, No. 11, pp. 1723-1732, Nov. 1996.*

(Continued)

*Primary Examiner* — Daniel Washburn
*Assistant Examiner* — Amneet Singh
(74) *Attorney, Agent, or Firm* — Zagorin Cave LLP

(57) ABSTRACT

A gap detector detects when a phase difference between a feedback signal and a clock signal is larger than a gap threshold. If the phase difference is larger than the gap threshold, then the phase difference is modified by subtracting a gap value from the phase difference. If the phase difference is less than the threshold, the phase difference is not modified. A loop filter receives and filters the modified or unmodified phase difference and controls an oscillator. An accumulator circuit accumulates the modified phase difference and supplies a phase adjust signal. A low pass filter receives the phase adjust signal and supplies a filtered phase adjust signal that is used to slowly adjust the output of the oscillator.

20 Claims, 2 Drawing Sheets

(56) References Cited

U.S. PATENT DOCUMENTS

| | | | | |
|---|---|---|---|---|
| 2008/0191746 A1* | 8/2008 | Friedman | ............ | H03D 13/004 |
| | | | | 327/5 |
| 2009/0302906 A1* | 12/2009 | Rhee | ................ | G01R 31/31709 |
| | | | | 327/156 |
| 2010/0045391 A1* | 2/2010 | Wang | ...................... | H03L 7/183 |
| | | | | 331/1 R |
| 2012/0236698 A1* | 9/2012 | Yoshida | ............... | G11B 7/1267 |
| | | | | 369/53.27 |
| 2015/0110233 A1* | 4/2015 | Azenkot | ................. | H03L 7/093 |
| | | | | 375/376 |
| 2016/0006544 A1* | 1/2016 | Cowley | ................... | H04L 1/205 |
| | | | | 375/226 |

OTHER PUBLICATIONS

International Telecommunication Union, "Series G: Transmission Systems and Media, Digital Systems and Networks," ITU-T G.8261/Y.1361, Aug. 2013, 116 pages.

International Telecommunication Union, "Series G: Transmission Systems and Media, Digital Systems and Networks," ITU-T G.8263/Y.1363, Amendment 2, May 2014, 22 pages.

International Telecommunication Union, "Series G: Transmission Systems and Media, Digital Systems and Networks," ITU-T G.8265.1/Y.1365.1, Jul. 2014, 32 pages.

* cited by examiner

DUAL PATH TIMING JITTER REMOVAL

BACKGROUND

Field of the Invention

The invention relates to jitter and more particularly to dealing with jitter that contains large systematic jitter relative to random jitter.

Description of the Related Art

Optical transport networks (OTNs), broadcast video, and other applications use timing signals as part of the system to transport payloads. Such timing signals include a signal component caused by random or thermal related jitter. Thus, timing signals for one part of the system are nominally, but not exactly the same as timing signals for another part of the system. Phase-locked loops (PLLs) have traditionally been used to deal with the random jitter. However, transport networks may also insert systematic jitter in timing signals by, e.g., inserting gaps in clocks to align input and output data. For example, assume data is being received at a network node at a rate of 1 Gb/s but is being transmitted from the node at a slower rate of 1% less than 1 Gb/s. One way to deal with that rate difference is to skip pulses or insert gaps into the timing signal (nominally 1 Gb/s) transmitted with the slower transmitted data. Thus, skipping clock pulses can be used to account for slightly different input and output data rates.

Use of gapped clocks is a convenient technique used in communication systems to pass timing and frequency information. The technique has the advantage of being a simple and universal interface where frequency/timing information is embedded within the clock signal. The drawback of using the gapped clock technique, however, is the jitter caused by the gaps for the downstream system. Since the gaps are inserted by OTN mappers/de-mappers, there is no noise shaping, nor any pattern control of these gap insertions. To reduce the clock jitter for downstream systems, very low bandwidth jitter cleaning devices (e.g. below 10 Hz) are typically used to filter out the jitter/wander caused by clock gaps. Since the gap patterns are very unpredictable and difficult to model and characterize, system performance cannot be guaranteed. That is one reason gapped clock techniques are not widely used despite the cleanness in system partitioning afforded by gapped clocks. Other drawbacks of gapped clock use is that low bandwidth jitter cleaning, which is sensitive to temperature fluctuations, has excessive system response latency. In addition, gapped clock use increases system cost due to the need for very low bandwidth jitter cleaning devices.

SUMMARY OF EMBODIMENTS OF THE INVENTION

Accordingly, in one embodiment an apparatus includes a phase detector to supply a phase difference between an input clock signal and a feedback signal. A gap detector is coupled to the phase detector and detects when the phase difference is larger than a gap threshold. A first circuit is responsive to the detected difference being larger than the gap threshold to supply a modified phase difference in which a gap value is subtracted. The first circuit is responsive to the detected difference being smaller than the gap threshold to supply the phase difference. A loop filter receives an output of the first circuit and filters the output of the first circuit. An oscillator is controlled to supply an oscillator output signal according to the loop filter output. In embodiments, the amplitude of the gap value may be user programmed, estimated by the apparatus, or predetermined at manufacture.

In another embodiment a method includes determining when a phase difference between an input signal and a feedback is larger than a threshold. Responsive to the phase difference being larger than the threshold, a modified phase difference is generated as a loop filter input signal by subtracting a gap value. Responsive to the phase difference being less than the threshold, the phase difference is supplied as the loop filter input signal. A loop filter filters the loop filter input signal and supplies a loop filter output signal. An oscillator is controlled based on the loop filter output signal. The method may further include accumulating the gap value and supplying a phase adjust signal corresponding to the accumulated modified phase difference. The accumulated modified phase difference is filtered in a low pass filter that supplies a filtered phase adjust signal.

In another embodiment a method for a jitter cleaning phase-locked loop includes using a first path to remove jitter in a clock signal less than a predetermined threshold, the jitter corresponding to a phase difference between a feedback signal and the clock signal. A second path is used to remove the jitter in the clock signal above the predetermined threshold.

BRIEF DESCRIPTION OF THE DRAWINGS

The present invention may be better understood, and its numerous objects, features, and advantages made apparent to those skilled in the art by referencing the accompanying drawings.

The use of the same reference symbols in different drawings indicates similar or identical items.

DETAILED DESCRIPTION

Instead of relying on a PLL to filter out the gap jitter caused by insertion of gaps in clock signals, embodiments described herein detect the gap, and once detected, filter out the gap digitally. Thermal jitter still goes through a traditional jitter cleaning phase-locked loop. As a result of handling the large jitter digitally, a low PLL bandwidth is no longer the only tool available to clean up jitter and the system jitter performance becomes more insensitive to gap patterns, leading to guaranteed jitter performance. The PLL bandwidth can be set on the order of kHz instead of single digit Hz typically used in traditional gap clock filtering solutions.

Figure 1:
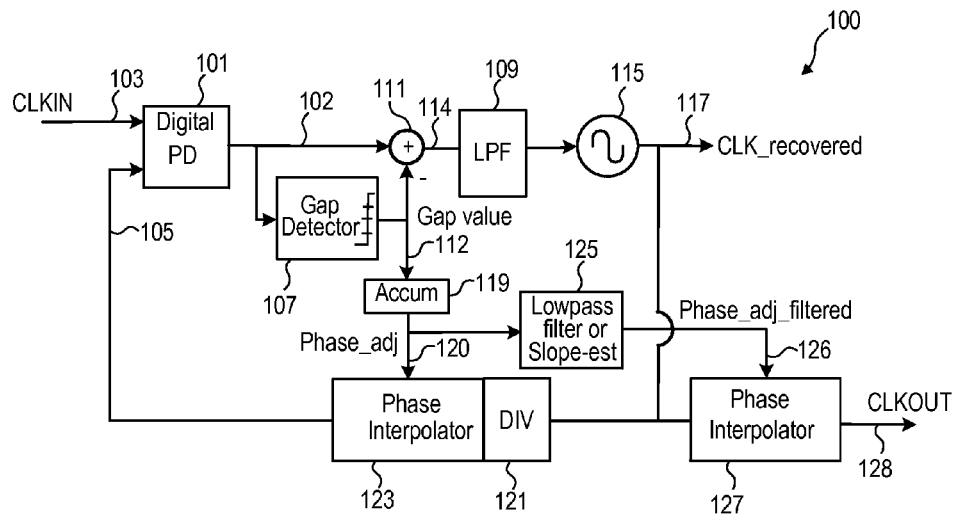
FIG. 1 illustrates an embodiment that separates thermal related jitter from systematic jitter and filters the different kinds of jitter separately.

Referring to FIG. 1, illustrated is an embodiment that separates thermal related jitter from more systematic jitter, and filters the different kinds of jitter separately, achieving better filtering. A digital phase detector (PD) 101 receives a clock signal (CLKIN) 103 and a feedback signal 105. The CLKIN signal 103 is a timing signal associated with data. In an embodiment, thermal jitter present in the CLKIN signal 103 goes through a traditional jitter cleaning phase-locked loop. The systematic jitter, e.g., caused by pulse skipping, once detected, is filtered out digitally as further described herein.

Figure 2A:
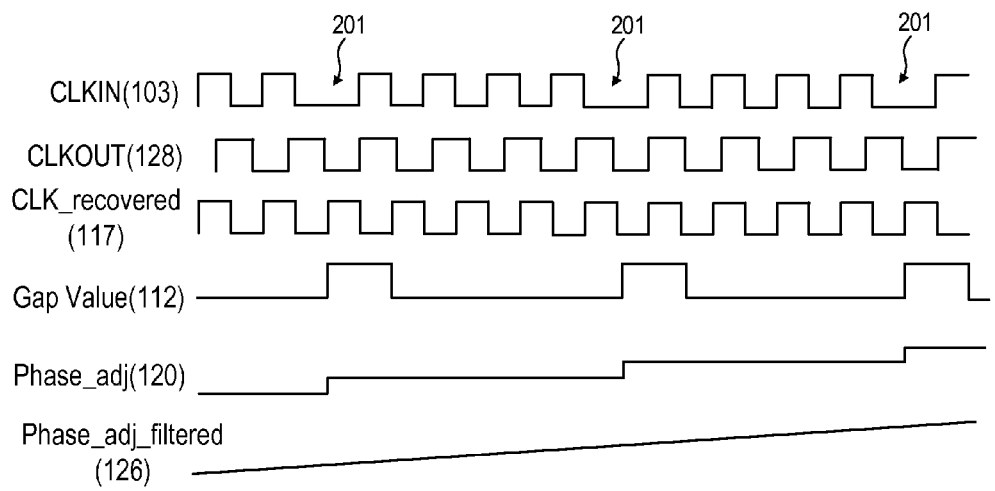
FIG. 2A illustrates a timing diagram associated with the embodiment of FIG. 1.

FIG. 2A illustrates an example timing diagram associated with the embodiment of FIG. 1. Assume that due to the need to align the clock with the data, CLKIN skips half a pulse every four cycles resulting in gaps 201. The ideal clock output, shown as CLKOUT, given the input clock CLKIN, is a clock with 9/10 the frequency of CLKIN with the clock pulses equally spread out.

Referring again to FIG. 1, the digital phase detector 101 detects the phase difference between the feedback signal 105 and the input clock (CLKIN) 103 and supplies a digital signal 102 corresponding to the difference. When a gap 201 occurs, the PD 101 generates the digital signal 102 with a value corresponding to the gap. Gap detector 107 detects when the output 102 of the phase detector 101 is above a predetermined threshold. For example, the threshold may be the digital equivalent of 0.75 ns. When the phase information provided on the phase detector output is less than the threshold, the phase difference is presumed to be thermal related jitter and the phase difference is supplied to the loop filter 109 unchanged.

However, if the gap detector detects a value greater than the threshold, the gap detector subtracts the gap value (e.g., 1 ns) from the phase difference information 102 in summer 111. The gap value corresponds to an estimate of the gap present in the system. Note that the threshold and the gap value are not the same. Instead, the threshold is smaller than the gap value. After subtraction, the remaining value can be zero, positive, or negative. The residual error remaining after the subtraction, which is assumed to be thermal jitter, is supplied to the loop filter 109.

Figure 2B:
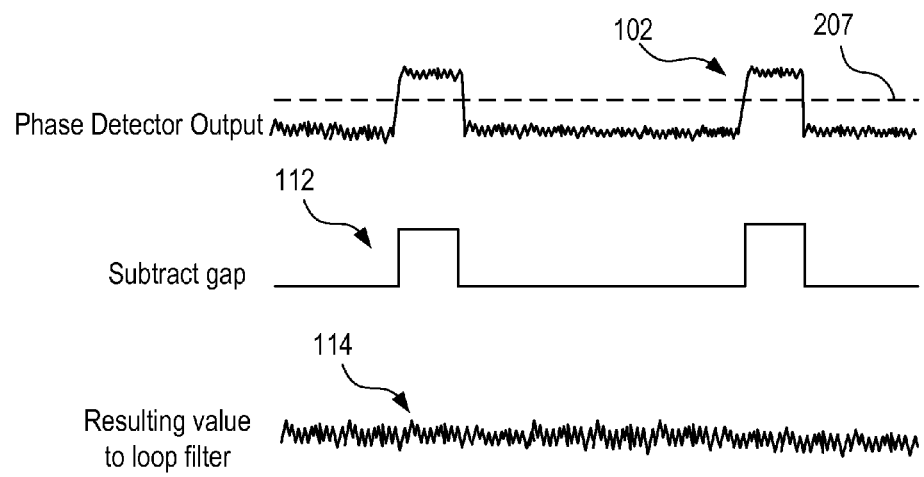
FIG. 2B illustrates operation of the gap detector and gap subtraction.

FIG. 2B illustrates operation of the gap detection and subtraction. The phase detector output 102 is compared to gap detector threshold 207. When the output of the phase detector is less than the threshold 207, the output 114 from the summer 111 supplied to the loop filter is assumed to be thermal jitter. However, when the output of the phase detector is more than the threshold 207, the gap 112 is subtracted from the phase detector output in summer 111 to cause the output 114 from the summer 111 to also appear as thermal jitter to be handled by the loop filter 109. A separate path handles the larger amplitude gap jitter.

Referring again to FIG. 1, the loop filter 109 controls the oscillator 115, which may be, e.g., a direct digital synthesis oscillator, a digitally controlled oscillator, or any suitable oscillator in accordance with system requirements and process constraints. The oscillator 115 supplies CLK_recovered 117. As shown in FIG. 2A, CLK_recovered is the original clock frequency before the gaps were inserted. The output 117 of the oscillator 115 is fed back through divider 121 and phase interpolator 123 to the digital phase detector 101.

FIGS. 1, 2A and 2B show the gap value 112 of the gap detector supplied by the gap detector 107. The gap detector 107 supplies an accumulator 119 with gap value 112, which keeps track of the accumulated gap difference. The accumulator 119 supplies the accumulated gap difference 120, also referred to herein as phase adjust signal, to the phase interpolator 123 to reintroduce the gap back into the PLL through the feedback path. The phase adjust signal 120 is shown in FIG. 2 as a series of steps, each step associated with a detected gap. The goal is to supply a CLKOUT signal reflecting the frequency of the input clock signal with no abrupt phase steps in the presence of input gaps and hence significantly reduced jitter. In order to maintain the same frequency between CLKOUT and feedback clock 105, the phase adjustment done by phase interpolator 123 is compensated by phase interpolator 127. The accumulator 119 supplies a low pass filter (or slope estimator) 125. The low pass filter is a very low frequency low pass filter, e.g., on the order of 1 to 100 Hz. That helps ensure that any abrupt changes in phase are reflected in the output signal slowly to reduce jitter impact. The low pass filter 125 generates the filtered phase adjust signal 126 shown in FIGS. 1 and 2A. The filtered phase adjust signal 126 reflects the phase difference between the CLK_recovered signal 117 and the CLKOUT signal 128. The low pass filter 125 supplies the filtered phase adjust signal 126 to a second phase interpolator 127 that slowly adjusts the CLK_recovered signal based on the linear ramp of the filtered phase adjust signal to obtain the CLKOUT signal.

Some embodiments may accommodate multiple levels of gaps. For example, some systems may have gap time durations nominally expected to be greater than 2 ns and other systems have gaps expected to be greater than 0.5 ns. Some systems may skip one pulse, other systems may skip multiple pulses at one time leading to a larger gap. In an embodiment the gap detector can be programmed to detect gaps of 20 ps, 40 ps, 80 ps, 160 ps, 320 ps, 640 ps, 1.2 ns, 2.4 ns, 4.8 ns, 9.6 ns, or $\frac{1}{512}$, $\frac{1}{256}$, $\frac{1}{128}$, $\frac{1}{64}$, $\frac{1}{32}$, $\frac{1}{16}$, $\frac{1}{8}$, $\frac{1}{4}$, $\frac{1}{2}$ or whole period of the input clock. Such numbers are of course examples, and other embodiments may use additional or other gap values and gap detect thresholds suitable for the systems in which the embodiments may be utilized.

Thus, the gap detector may have a programmable gap detector that can be programmed by writing to memory associated with the gap detector. Both the gap value and/or the threshold value may be written to the memory.

In another embodiment, both the gap value and the threshold value may be estimated by the device. The gap value may be determined by estimating the step size in phase detector output 102 with proper averaging, and the gap detector threshold can be set as a percentage, e.g., 75% of the estimated gap value. In one embodiment to estimate the gap value, successive phase detector outputs are compared and when the difference between successive phase detector outputs is large, e.g., above a threshold difference value of 0.1 ns, a gap is presumed to be causing the large difference. Other threshold difference values may of course be utilized as appropriate. The value of the phase detector output corresponding to the large value is saved. That process is repeated until a suitable number of gap samples have been collected. That suitable number may be three or more according to the needs of the system. The samples are averaged to generate the gap value used in the embodiments of FIGS. 1 and 3. The threshold value may be set to a percentage, e.g., 50% or 75%, of the gap value.

Figure 3:
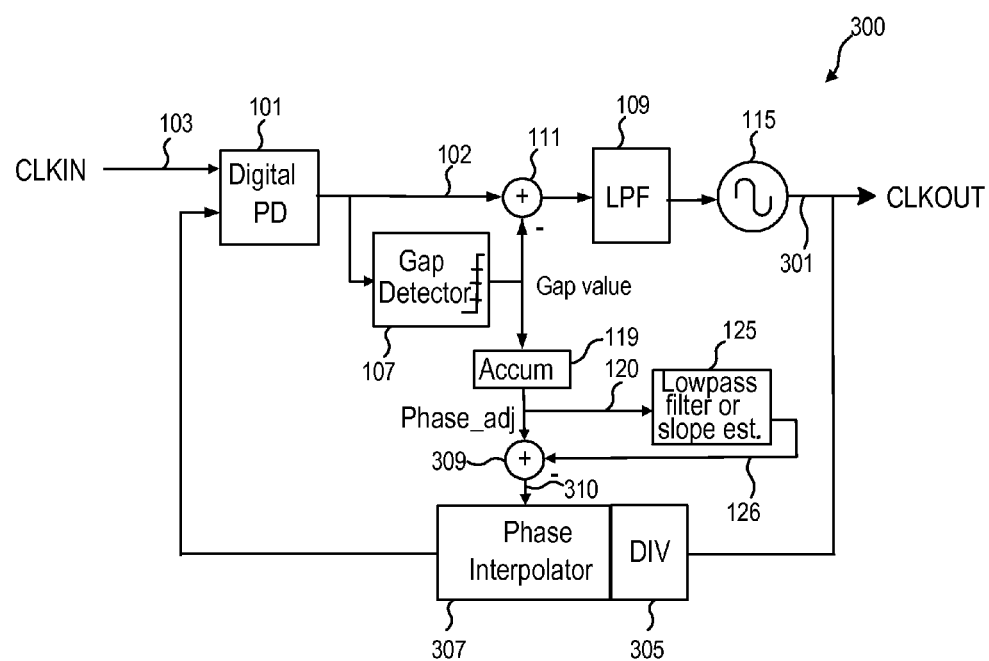
FIG. 3 illustrates an embodiment that separates thermal related jitter from systematic jitter and filters the different kinds of jitter separately and utilizes one phase interpolator.

While FIG. 1 illustrates one embodiment of a system utilizing a gap detector and two phase interpolators, FIG. 3 illustrates another embodiment in which a single phase interpolator is used. As can be seen in FIG. 3, the PLL 300 is similar to the PLL 100 of FIG. 1. The PLL 300 includes the digital phase detector 101, the gap detector 107, the summing circuit 111, the loop filter 109, the oscillator 115, and the accumulator 119. The CLKOUT signal 301 is supplied by the oscillator 115, rather than the phase interpolator 127 of FIG. 1. The feedback path feeds back CLKOUT 301 through the divider 305 and phase interpolator 307 to the digital phase detector 101. The accumulator 119 supplies the phase adjust signal 120 to the low pass filter or slope estimator 125. The slope estimator supplies the filtered phase adjust signal 126 to a summing circuit 309 that subtracts the filtered phase adjust signal 126 from the phase adjust signal and supplies the resulting signal 310 to the phase interpolator 307. The filtered phase adjust ramp 126 still represents the difference between CLKOUT and CLK_recovered. Thus, the linear phase ramp slowly adjusts the CLKOUT signal 301 to the frequency corresponding to the gapped clock so that it appears the same as the CLKOUT signal 128 (FIG. 1). One advantage of FIG. 3 is that only a single phase interpolator is required. Both of the embodiments of FIGS. 1 and 3 have the advantage that the systematic gap jitter is removed from the signal going into the loop filter hence the VCO is not corrupted by the systematic gap jitter. As a result, PLL bandwidth is not controlled by the need for gap removal and bandwidths (of PLLs 100 or 300) can be on the order of, e.g., 100 Hz~10 kHz, rather than the very low PLL bandwidth previously required.

The description of the invention set forth herein is illustrative, and is not intended to limit the scope of the invention as set forth in the following claims. Variations and modifications of the embodiments disclosed herein, may be made based on the description set forth herein, without departing from the scope and spirit of the invention as set forth in the following claims.

What is claimed is:

1. An apparatus comprising:
   a phase detector to supply a phase difference between an input clock signal and a feedback signal;
   a gap detector coupled to the phase detector to detect when the phase difference is larger than a gap threshold and generate a detected difference;
   a first circuit responsive to the detected difference being larger than the gap threshold to supply a modified phase difference in which a gap value is subtracted, the first circuit being responsive to the detected difference being smaller than the gap threshold to supply the phase difference;
   a loop filter coupled to an output of the first circuit to filter the output of the first circuit and supply a loop filter output;
   an oscillator controlled to supply an oscillator output signal according to the loop filter output;
   an accumulator circuit coupled to the gap detector to accumulate the gap value and supply a phase adjust signal; and
   a first phase adjust circuit coupled in a feedback path between the oscillator and the phase detector and coupled to adjust a phase of a first phase adjust circuit input signal, to thereby cause the feedback signal to have a phase based, at least in part, on the phase adjust signal.

2. The apparatus as recited in claim 1 further comprising:
   a low pass filter coupled to the accumulator circuit to receive the phase adjust signal and supply a filtered phase adjust signal.

3. The apparatus as recited in claim 2 further comprising:
   a second circuit configured to subtract the filtered phase adjust signal from the phase adjust signal and supply a modified phase adjust signal;
   wherein the first phase adjust circuit is configured to adjust the phase of the first phase adjust circuit input signal based on the modified phase adjust signal.

4. The apparatus as recited in claim 3 further comprising:
   a divider circuit coupled to the oscillator output signal and coupled to supply the phase adjust circuit input signal.

5. The apparatus as recited in claim 2 further comprising:
   a second phase adjust circuit coupled to the oscillator output signal to adjust a phase associated with the oscillator output signal based on the filtered phase adjust signal to generate an output signal with reduced jitter.

6. The apparatus as recited in claim 5 further comprising:
   a divider circuit in the feedback path to divide a received signal based on the oscillator output signal and supply the phase adjust circuit input signal.

7. The apparatus as recited in claim 1 wherein a gap larger than the gap threshold is caused by a gapped clock.

8. The apparatus as recited in claim 1 further comprising a phase-locked loop (PLL) including the phase detector, the loop filter, and the oscillator.

9. The apparatus as recited in claim 1 wherein the phase difference is reduced by subtracting the gap value from the phase difference to generate the modified phase difference.

10. The apparatus as recited in claim 1 wherein the gap threshold is a programmable value.

11. A method comprising:
    determining in a phase detector a phase difference between an input signal and a first feedback signal;
    responsive to the phase difference being larger than a threshold, generating a modified phase difference as a loop filter input signal by subtracting a gap value from the phase difference;
    responsive to the phase difference being less than the threshold, supplying the phase difference as the loop filter input signal;
    filtering the loop filter input signal in a loop filter and supplying a loop filter output signal;
    controlling an oscillator based on the loop filter output signal;
    accumulating the gap value and supplying a phase adjust signal corresponding to the accumulated gap value; and
    in generating the first feedback signal, adjusting a phase of a second feedback signal in a first phase adjust circuit in a feedback path between the oscillator and the phase detector based, at least in part, on the phase adjust signal.

12. The method as recited in claim 11 further comprising:
    filtering the phase adjust signal in a low pass filter and supplying a filtered phase adjust signal.

13. The method as recited in claim 12 further comprising:
    subtracting the filtered phase adjust signal from the phase adjust signal and supplying a modified phase adjust signal; and
    adjusting the phase of the second feedback signal based on the modified phase adjust signal.

14. The method as recited in claim 13 further comprising:
    dividing a third feedback signal coupled to an output of the oscillator to generate the second feedback signal.

15. The method as recited in claim 12 further comprising:
    adjusting a phase of an output signal coupled to the oscillator in a second phase adjust circuit based on the filtered phase adjust signal to generate a second output signal with reduced jitter.

16. The method as recited in claim 15 further comprising:
    dividing a signal coupled to an output of the oscillator;
    supplying a divided signal to the first phase adjust circuit; and
    adjusting a phase of the divided signal to generate the first feedback signal.

17. The method as recited in claim 11 further comprising programming the gap threshold by writing a programmable register.

18. The method as recited in claim 11 further comprising estimating the gap value by averaging and generating an estimated gap value.

19. The method as recited in claim 18 further comprising determining the threshold as a predetermined percentage of the estimated gap value.

20. A phase-locked loop comprising:
- a phase detector to supply a phase difference between an input clock signal and a feedback signal;
- a gap detector coupled to the phase detector to detect when the phase difference is larger than a gap threshold and generate a detected difference;
- a first circuit responsive to the detected difference being larger than the gap threshold to supply a modified phase difference in which a gap value is subtracted, the first circuit being responsive to the detected difference being smaller than the gap threshold to supply the phase difference;
- a loop filter coupled to an output of the first circuit to filter the output of the first circuit and supply a loop filter output;
- an oscillator controlled according to the loop filter output;
- an accumulator circuit coupled to the gap detector to accumulate the gap value and supply a phase adjust signal; and
- a phase adjust circuit coupled between the oscillator and the phase detector and configured to generate the feedback signal with a phase determined, at least in part, by the phase adjust signal.

* * * * *